(12) United States Patent
Ivanov et al.

(10) Patent No.: US 7,505,141 B2
(45) Date of Patent: Mar. 17, 2009

(54) INTERFEROMETRIC APPARATUS FOR PRODUCING AN OUTPUT SIGNAL CHARACTERISTIC OF PHASE AND/OR AMPLITUDE NOISE OF A DEVICE

(76) Inventors: Eugene Nikolay Ivanov, Department of Physics, University of Western Australia, Mounts Bay Road, Crawley, Western Australia (AU) 6009; Alison Clare Fowler, 41 Burragah Way, Duncraig, Western Australia (AU) 6023; Michael Edmund Tobar, Department of Physics, University of Western Australia, Mounts Bay Road, Mounts Bay Road, Crawley (AU) 6009

( * ) Notice: Subject to any disclaimer, the term of this patent is extended or adjusted under 35 U.S.C. 154(b) by 86 days.

(21) Appl. No.: 11/656,147

(22) Filed: Jan. 22, 2007

(65) Prior Publication Data

US 2007/0188766 A1     Aug. 16, 2007

(30) Foreign Application Priority Data

Jan. 20, 2006    (AU) ............................. 2006900297

(51) Int. Cl.
    *G01B 9/02*     (2006.01)
    *G01N 21/00*    (2006.01)
(52) U.S. Cl. ...................................... 356/477; 356/73.1
(58) Field of Classification Search ................ 356/73.1, 356/450, 477, 479
See application file for complete search history.

(56) References Cited

U.S. PATENT DOCUMENTS 6,753,690 B2 *   6/2004   Ivanov et al. ................ 324/639

FOREIGN PATENT DOCUMENTS

AU           736234      1/1998
WO     WO 95/32435    11/1995

* cited by examiner

*Primary Examiner*—Michael A Lyons
(74) *Attorney, Agent, or Firm*—Reising Ethington P.C.

(57) ABSTRACT

An interferometric apparatus (10) for producing an output signal characteristic of phase and/or amplitude noise of a device under test (22), an input signal being provided to the interferometric apparatus (10), comprising a signal generation means (36,38) arranged to produce a third signal having a carrier frequency offset from that of the input signal; a first bridge (12) having first (14) and second (16) arms, the first (14) and second (16) arms having input thereto first and second signals, respectively, produced from one of the input signal or the third signal; the device under test (22) being provided in one of the first (14) or second (16) arms of the first bridge (12); a carrier suppression means (24) connected to the first (14) and second (16) arms of the first bridge (12) to produce a carrier suppressed signal; a first amplifier (32) arranged to amplify the carrier suppressed signal; first mixing means (34) responsive to the third signal and to the carrier suppressed signal to produce a signal characteristic of phase and/or amplitude noise of the device under test (22) at an offset frequency.

17 Claims, 4 Drawing Sheets

INTERFEROMETRIC APPARATUS FOR PRODUCING AN OUTPUT SIGNAL CHARACTERISTIC OF PHASE AND/OR AMPLITUDE NOISE OF A DEVICE

FIELD OF THE INVENTION

This invention relates to an interferometric apparatus for measuring the phase and/or amplitude noise of a device at microwave frequencies.

Throughout the specification, unless the context requires otherwise, the word "comprise" or variations such as "comprises" or "comprising", will be understood to imply the inclusion of a stated integer or group of integers but not the exclusion of any other integer or group of integers.

BACKGROUND ART

One technique used to measure the phase and/or amplitude noise of a device at microwave frequencies is to interrogate the device using a reference signal. The device adds amplitude and/or phase noise to the reference signal to produce a modified signal. The modified signal is then compared to the reference signal using a double-balanced mixer, which produces a baseband signal representative of the phase or amplitude noise of the device, according to the relative phase between the reference signal and the modified signal input to the mixer.

A limitation of the sensitivity of this method is the noise of the mixer itself, which can dominate the baseband signal if the device is sufficiently low noise.

Improved methods and apparatus for measuring phase and/or amplitude characteristics were disclosed in Australian patent 695262 entitled "Phase noise detector" and Australian patent 736234 entitled "Interferometric signal processing apparatus", the contents of both of which are incorporated herein by reference.

Both references utilise carrier suppression to enable amplification of the noise sidebands of the modified signal and to reduce the influence of the mixer noise on the baseband signal.

However, the mixer's noise, including DC voltage drift, still influences the baseband signal, albeit at a far lower level, and typically only at small frequency offsets from the microwave signal.

The previous discussion of the background art is intended to facilitate an understanding of the present invention only. It should be appreciated that the discussion is not an acknowledgement or admission that any of the material referred to was part of the common general knowledge as at the priority date of the application.

DISCLOSURE OF THE INVENTION

In accordance with a first aspect of this invention, there is provided an interferometric apparatus for producing an output signal characteristic of phase and/or amplitude noise of a device under test, an input signal being provided to the interferometric apparatus, comprising:

a signal generation means arranged to produce a third signal having a carrier frequency offset from that of the input signal;

a first bridge having first and second arms, the first and second arms having input thereto first and second signals, respectively, produced from one of the input signal or the third signal;

the device under test being provided in one of the first or second arms of the first bridge;

a carrier suppression means connected to the first and second arms of the first bridge to produce a carrier suppressed signal;

a first amplifier arranged to amplify the carrier suppressed signal;

first mixing means responsive to the third signal and to the carrier suppressed signal to produce a signal characteristic of phase and/or amplitude noise of the device under test at an offset frequency.

In the previous statement and throughout this specification the term 'device under test' is intended to mean any device responsive to a signal at the carrier frequency of the first and second signals, and may include a number of components or a network.

According to a preferred feature of the invention, the interferometric apparatus further comprises signal processing means responsive to the signal from the first mixing means to produce the output signal.

According to a preferred embodiment, the signal processing means comprises lock-in amplifier means arranged to produce the offset signal and to operate at the frequency of the offset signal.

According to a preferred embodiment, the output signal is the signal from the first mixing means.

According to a preferred embodiment, the signal generation means is provided between the carrier suppression means and the first mixing means.

According to a preferred embodiment, the first and second signals are the input signal.

According to a preferred embodiment, the signal generation means is before the first bridge, the first and second signals being the third signal.

According to a preferred embodiment, the carrier suppression means comprises a power combiner, a phase shift means and an amplitude matching means, the phase shift means and the amplitude matching means being arranged such that the power combiner produces the carrier-suppressed signal from signals input thereto.

According to a preferred feature of the invention, the interferometric apparatus further comprises a signal processing means responsive to the signal from the first mixing means to produce the output signal, wherein the signal generation means comprises a second mixing means responsive to an offset signal and to a carrier-dominated signal to produce said third signal, said carrier-dominated signal having a carrier frequency the same as that of the input signal so that the carrier frequency of the third signal is spaced from that of the carrier-dominated signal by the carrier frequency of the offset signal.

According to a preferred feature of the invention, the signal generation means further comprises a second bridge and second carrier suppression means, the second mixing means being provided in one of the first or second arms of the second bridge, the second carrier suppression means being connected to the first and second arms of the second bridge to suppress, in the third signal, the carrier frequency of the carrier-dominated signal.

According to a preferred feature of the invention, the signal generation means further comprises a second amplifier responsive to the third signal to produce an amplified third signal, the first mixing means being responsive to said amplified third signal.

According to a preferred embodiment, the signal processing means further comprises a divide-by-2 frequency divider provided between the lock-in amplifier means and the second mixing means.

The invention will be more fully understood in the light of the following description of several specific embodiments:

BRIEF DESCRIPTION OF THE DRAWINGS

The description is made with reference to the accompanying drawings, of which.

DETAILED DESCRIPTION OF PREFERRED EMBODIMENTS

Figure 1:
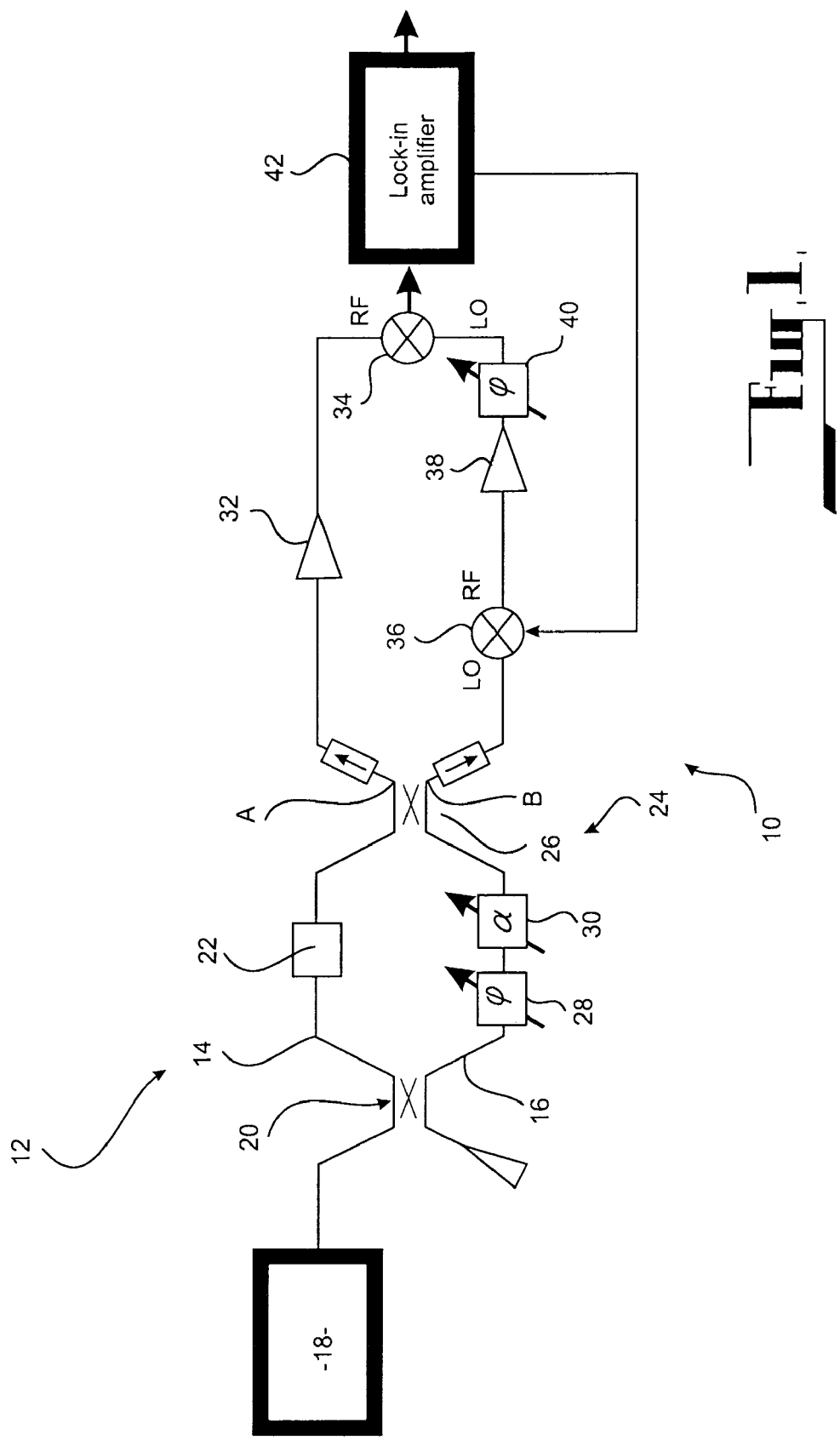
FIG. 1 is a schematic diagram of an interferometric apparatus according to the first embodiment of the invention.

Shown in FIG. 1 is an interferometric apparatus 10 according to the first embodiment, comprising a first bridge 12 having first and second arms 14 and 16. A signal generator 18 provides an input signal that becomes a first signal and a second signal input to the first and second arms 14 and 16, respectively, via a power splitter 20.

A device under test 22 is provided in the first arm 14 of the first bridge 12.

A carrier suppression means 24 is provided, in the form of a power combiner 26, phase shifter 28 and attenuator 30. The phase shifter 28 and the attenuator 30 are provided in the second arm 16 of the first bridge 12. The power combiner 26 is connected to the first and second arms 14 and 16. The phase shifter 28, attenuator 30 and power combiner 26 are arranged to produce a carrier-suppressed signal at an output A of the power combiner 26 and to produce a carrier-dominated signal at an output B of the power combiner 26, as described in the references incorporated herein.

A first amplifier 32 is provided in connection with the output A of power combiner 26 and arranged to amplify the carrier suppressed signal.

A first mixer 34, a double-balanced mixer in this embodiment, is provided at the output of the first amplifier 32 and is arranged such that its RF port is responsive to the amplified, carrier-suppressed signal.

A second mixer 36 and second amplifier 38 form a signal generation means in the embodiment. The second mixer 36 is provided at the output B of the power combiner 26 and is responsive to a fourth signal and to an offset signal provided from a lock-in amplifier 42. In this embodiment, the fourth signal is the carrier-dominated signal from the output B of the power combiner 26.

The second mixer 36 produces a third signal at its RF port. The third signal has a carrier frequency offset from that of the carrier-dominated signal by the frequency offset signal. Mathematically, this is simply expressed as:

$$f_{third} = f_{carrier-dominated} \pm f_{offset}$$

where $f_{carrier-dominated}$ is the carrier frequency of the carrier-dominated signal, $f_{offset}$ is the carrier frequency of the offset signal; and $f_{third}$ is the carrier frequency of the third signal.

The second amplifier 38 is provided to amplify the third signal which is then input to the first mixer 34's LO port. The second amplifier 38 may be omitted if the third signal produced by the second mixer 36 has sufficient power to directly drive the first mixer 34.

A second phase shifter 40 is provided between the second amplifier 38 and the first mixer 34 to adjust the relative phase between the signals appearing at the first mixer 34's LO and RF ports and thereby adjust whether the intermediate signal and output signal are representative of the phase noise and/or amplitude noise of the device under test 22.

The first mixer 34 produces a signal at carrier frequency $f_{offset}$ and which also contains phase and/or amplitude noise from the device under test 22 according to the arrangement of the phase shifter 40.

The signal from the first mixer 34 is input to the lock-in amplifier 42 which acts to produce the offset signal and an output signal therefrom. In this embodiment, the output signal is a baseband signal containing the phase and/or amplitude noise of the device under test, that may be analysed using instruments such as FFT analysers, and may also be used as a control signal—for example in a feedback control system to reduce the phase and/or amplitude noise of the device under test 22.

Advantageously, by providing signals at the LO and RF ports of the first mixer 34 that are offset in frequency by the offset signal, the phase and/or amplitude noise from the device under test 22 is present in the mixer 34's output signal about the offset frequency, removed from the first mixer 34's 1/f noise and/or dc-drift signals that may be superimposed on the mixer output that can be deleterious to measurements of close-to-the-carrier noise. The lock-in amplifier then acts to translate the device under test 22's phase and/or amplitude noise to baseband to produce the output signal, and in doing so translates the first mixer 34's 1/f noise and/or dc-drift to the frequency of the offset signal, which is chosen to be such that it is higher than the frequencies of interest being measured in the output signal.

In addition, while the second mixer 36 and second amplifier 38 also generate noise, the signal output from the first mixer 34 is effectively immune to this noise provided there is sufficient carrier suppression by the power combiner 26.

Figure 2:
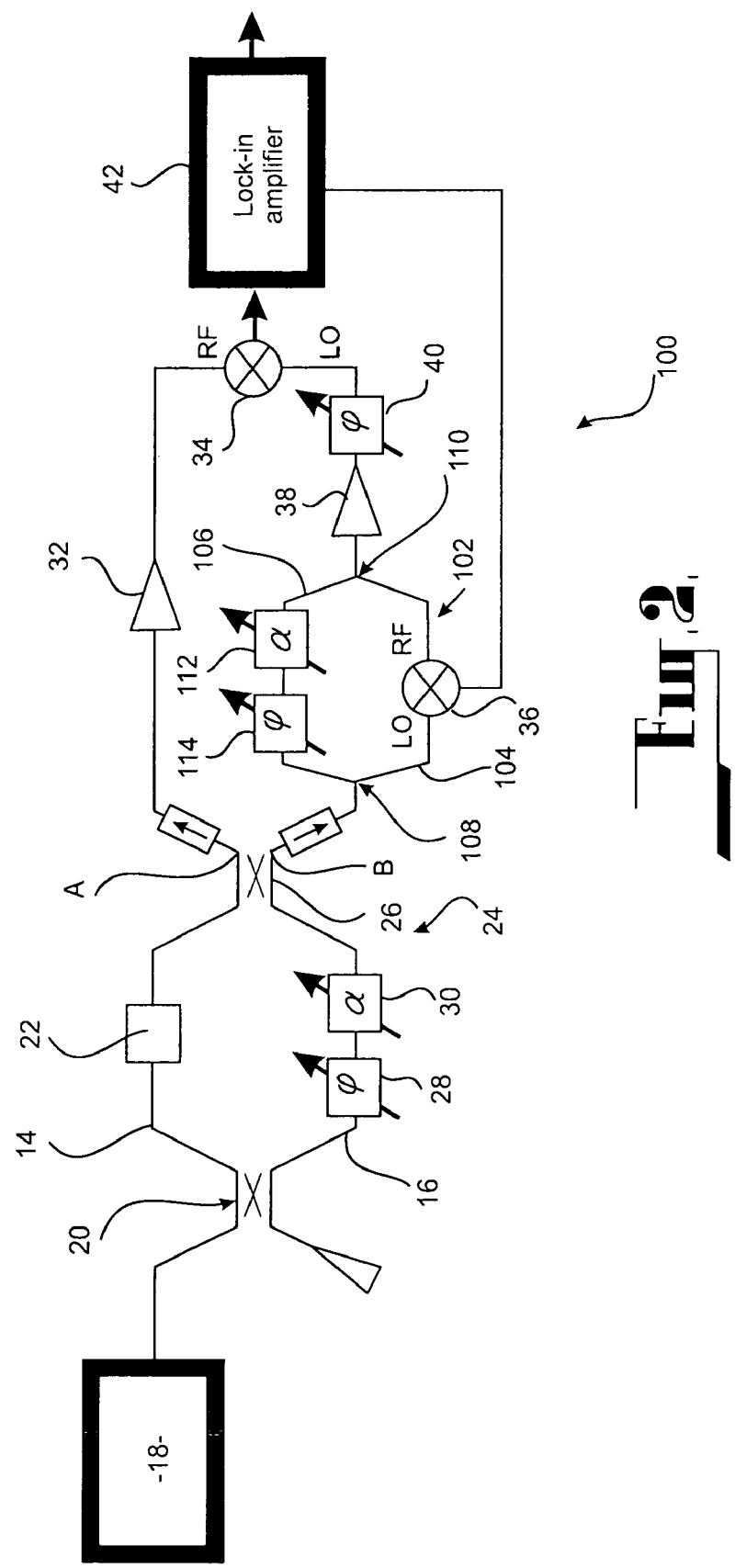
FIG. 2 is a schematic diagram of an interferometric apparatus according to the second embodiment of the invention.

A second embodiment of the invention, interferometric apparatus 100, is shown in FIG. 2, with like reference numerals denoting like parts to those in the first embodiment.

The interferometric apparatus 100 is similar to the interferometric apparatus 10 of the first embodiment, with the exception that the interferometric apparatus 100 includes a second bridge 102 having first and second arms 104 and 106, respectively.

The second bridge 102, forming pair of the signal generation means of the embodiment, is provided between the output B of the power combiner 26 and the second amplifier 38. The second mixer 36 is provided in the first arm 104 of the second bridge 102. A power splitter 108 is provided at one end of the second bridge 102 so the carrier-dominated signal is input to the first and second arms 104 and 106 thereof.

A second carrier suppression means comprising a second power combiner 110, second attenuator 112 and third phase shifter 114 is provided at the other end of the second bridge 102. The second attenuator 112 and third phase shifter 114 are provided in the second arm 106 and arranged so that the power combiner 110 acts to suppress the carrier frequency of the carrier-dominated signal from the third signal output from the second mixer 36. This may be necessary if the second mixer 36's isolation between its LO and RF ports is low, whereupon the carrier-dominated signal feeds across and appears in the third signal to the extent that interferes with the desired operation of the interferometric apparatus 100.

Figure 3:
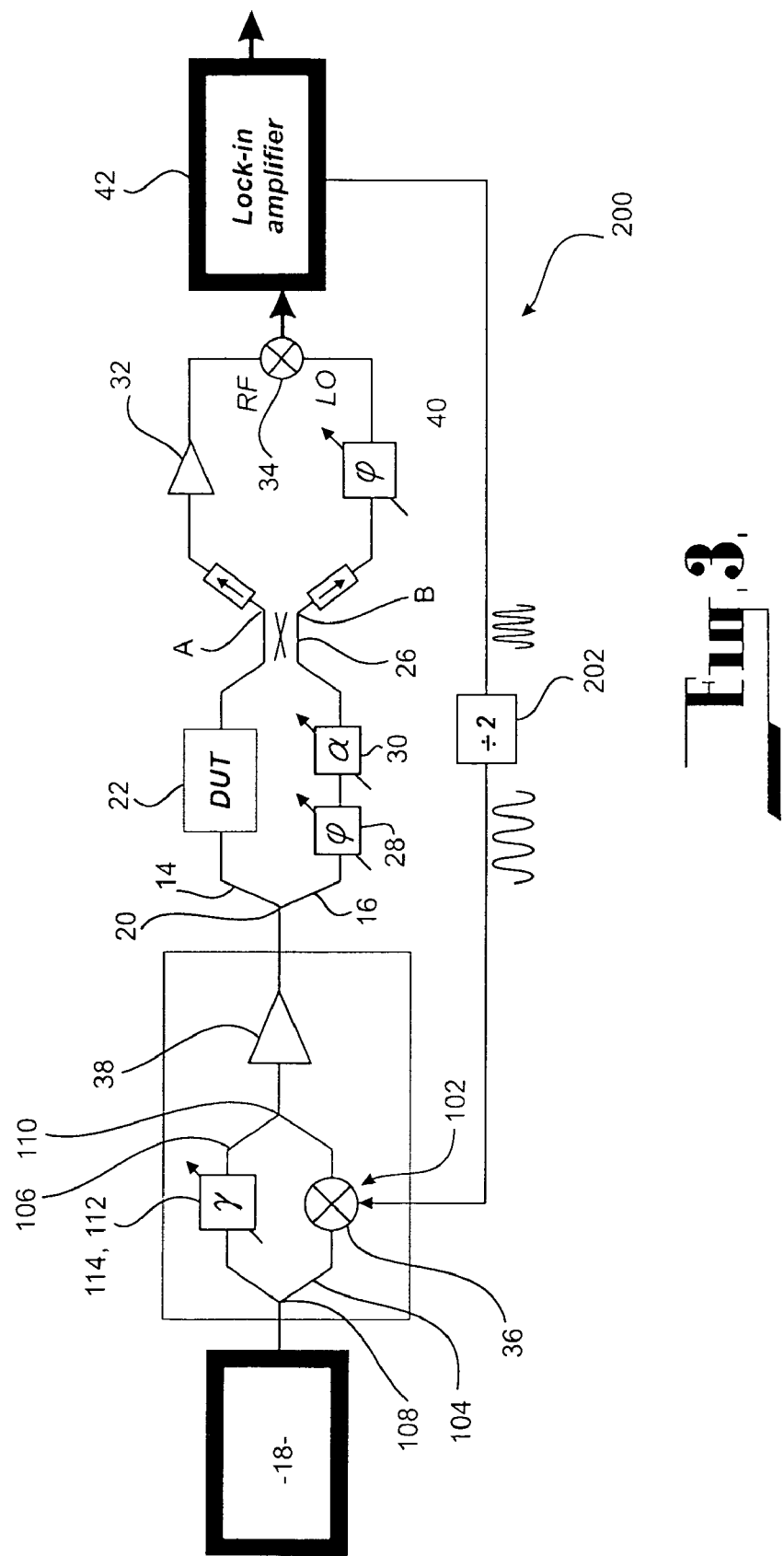
FIG. 3 is a schematic diagram of an interferometric apparatus according to the third embodiment of the invention.

A third embodiment of the invention, interferometric apparatus 200, is shown in FIG. 3, with like reference numerals denoting like parts to those in the second embodiment.

The interferometric apparatus 200 is similar to the apparatus 100 of the second embodiment, except that a signal combination means formed by the second bridge 102, comprising the second mixer 36 therein, and second amplifier 38 is provided between the signal generator 18 and the first bridge 12, and also that a frequency divider 202 is provided between the lock-in amplifier 42 and the second mixer 36. In this embodiment, the fourth signal is the input signal from the signal generator 18.

By placing the signal combination means at the input to the first bridge 12, the third signal, output from the amplifier 38, drives the first bridge 12. The frequency divider 202 is placed between the lock-in amplifier 42 and the second mixer 36 so that the signal produced by the first mixer 34 is still at carrier frequency $f_{offset}$.

Figure 4:
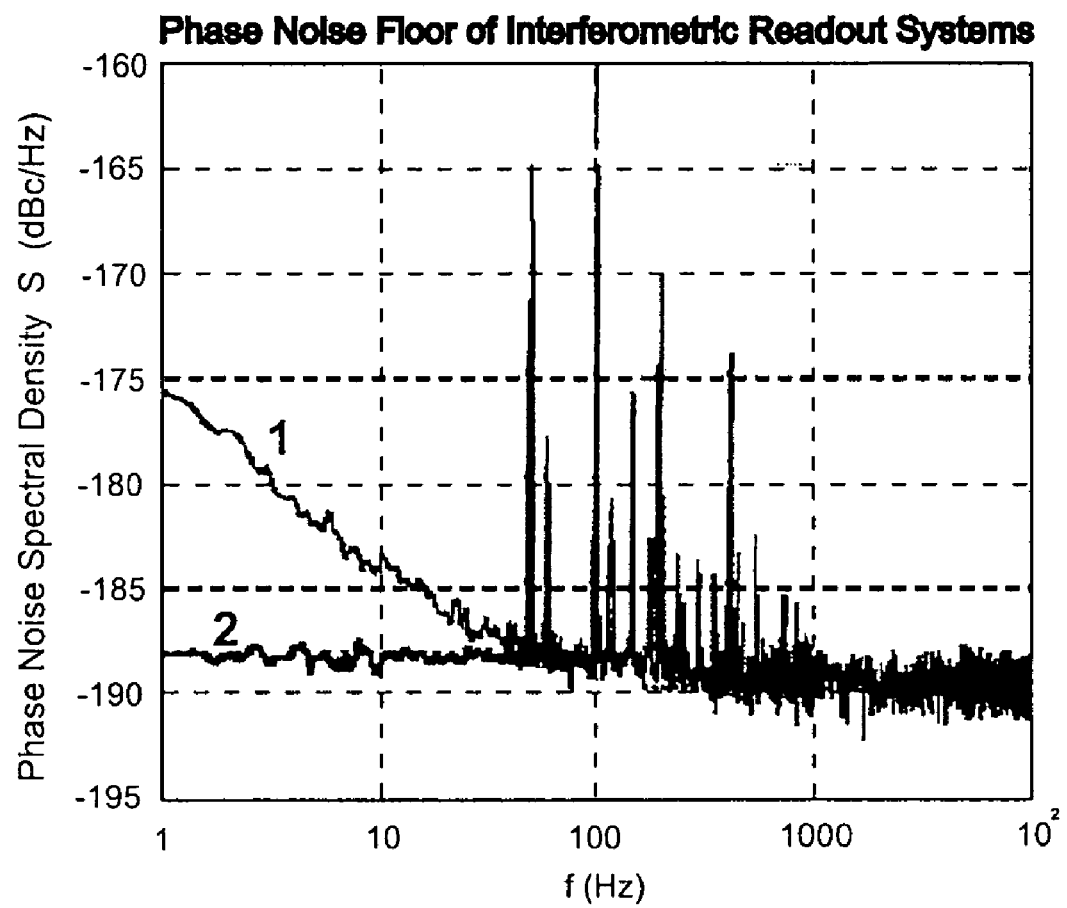
FIG. 4 shows the noise floor of the first embodiment compared to prior art interferometric apparatus.

FIG. 4 shows the improvement in the phase noise floor achieved using the interferometric apparatus 100 (curve "2") compared to prior art interferometric measurement apparatus (curve "1"). As seen from FIG. 4, above fourier offset frequencies of approximately 100 Hz, both systems have comparable noise floors which are set by thermal noise limits. Below 100 Hz, the first mixer's 1/f noise can be seen in curve 1, limiting the sensitivity of measurements that can be achieved using the prior alt. In contrast, the noise floor of the embodiment of the present invention continues to remain at levels close to the thermal noise limit, providing an improvement of more than 10 dB at 1 Hz fourier offset frequency.

It should be appreciated that the scope of this invention is not limited to the particular embodiment described above.

For example, the carrier-dominated signal may be the first or second signals rather than the output B from the power combiner 26. As another example, the output signal may be the signal output from the mixer 34 for processing in a digital signal system and the lock-in amplifier can be replaced with an offset frequency generator.

The invention claimed is:

1. An interferometric apparatus for producing an output signal characteristic of phase and/or amplitude noise of a device under test, an input signal being provided to the interferometric apparatus, comprising:
   a. signal generation means arranged to produce a third signal having a carrier frequency offset from that of the input signal;
   b. a first bridge having first and second arms, the first and second arms having input thereto first and second signals, respectively, produced from one of the input signal or the third signal;
   c. the device under test being provided in one of the first or second arms of the first bridge;
   d. carrier suppression means connected to the first and second arms of the first bridge to produce a carrier suppressed signal;
   e. a first amplifier arranged to amplify the carrier suppressed signal;
   f. first mixing means responsive to the third signal and to the carrier suppressed signal to produce a signal characteristic of phase and/or amplitude noise of the device under test at an offset frequency.

2. An interferometric apparatus as claimed at claim 1, wherein the interferometric apparatus further comprises signal processing means responsive to the signal from the first mixing means to produce the output signal.

3. An interferometric apparatus as claimed at claim 2 wherein the signal processing means comprises lock-in amplifier means arranged to produce an offset signal and to operate at the frequency of the offset signal.

4. An interferometric apparatus as claimed at claim 1, wherein the output signal is the signal from the first mixing means.

5. An interferometric apparatus as claimed at claim 1, wherein the signal generation means is provided between the carrier suppression means and the first mixing means.

6. An interferometric apparatus as claimed at claim 5, wherein the first and second signals are the input signal.

7. An interferometric apparatus as claimed at claim 1 wherein the signal generation means is before the first bridge, the first and second signals being the third signal.

8. An interferometric apparatus as claimed at claim 1 wherein the carrier suppression means comprises a power combiner, a phase shift means and an amplitude matching means, the phase shift means and the amplitude matching means being arranged such that the power combiner produces the carrier-suppressed signal from signals input thereto.

9. An interferometric apparatus for producing an output signal characteristic of phase and/or amplitude noise of a device under test, an input signal being provided to the interferometric apparatus, the interferometric apparatus comprising:
   a. signal generation means arranged to produce a third signal having a carrier frequency offset from that of the input signal;
   b. a first bridge having first and second arms, the first and second arms having input thereto first and second signals, respectively, produced from one of the input signal or the third signal;
   c. the device under test being provided in one of the first or second arms of the first bridge;
   d. carrier suppression means connected to the first and second arms of the first bridge to produce a carrier suppressed signal;
   e. a first amplifier arranged to amplify the carrier suppressed signal;
   f. first mixing means responsive to the third signal and to the carrier suppressed signal to produce a signal characteristic of phase and/or amplitude noise of the device under test at an offset frequency; and
   g. signal processing means responsive to the signal from the first mixing means to produce the output signal, wherein the signal generation means comprises second mixing means responsive to an offset signal and to a carrier-dominated signal to produce said third signal, said carrier-dominated signal having a carrier frequency the same as that of the input signal so that the carrier frequency of the third signal is spaced from that of the carrier-dominated signal by the carrier frequency of the offset signal.

10. The interferometric apparatus as claimed at claim 9, wherein the signal generation means further comprises a second bridge and second carrier suppression means, the second mixing means provided in one of the first or second arms of the second bridge, the second carrier suppression means connected to the first and second arms of the second bridge to suppress, in the third signal, the carrier frequency of the carrier-dominated signal.

11. The interferometric apparatus as claimed at claim 9 wherein the signal generation means still further comprises a second amplifier responsive to the third signal to produce an amplified third signal, the first mixing means being responsive to said amplified third signal.

12. The interferometric apparatus as claimed at claim 9 wherein the signal processing means comprises lock-in amplifier means arranged to produce the offset signal and to operate at the frequency of the offset signal.

13. The interferometric apparatus as claimed at claim 12, wherein the signal processing means further comprises a divide-by-2 frequency divider provided between the lock-in amplifier means and the second mixing means.

14. The interferometric apparatus as claimed at claim 9 wherein the signal generation means is provided between the carrier suppression means and the first mixing means.

15. The interferometric apparatus as claimed at claim 14, wherein the first and second signals are the input signal.

16. The interferometric apparatus as claimed at claim 9 wherein the signal generation means is before the first bridge, the first and second signals being the third signal.

17. The interferometric apparatus as claimed at claim 9, wherein the first carrier suppression means comprises a power combiner, a phase shift means and an amplitude matching means, the phase shift means and the amplitude matching means being arranged such that the power combiner produces the carrier-suppressed signal from signals input thereto.

* * * * *